United States Patent [19]

Faure et al.

[11] Patent Number: 5,124,561
[45] Date of Patent: Jun. 23, 1992

[54] PROCESS FOR X-RAY MASK WARPAGE REDUCTION

[75] Inventors: Thomas B. Faure, Georgia; Kurt R. Kimmel, Essex; James G. Ryan, Essex Junction; Timothy D. Sullivan, Underhill, all of Vt.

[73] Assignee: International Business Machines Corporation, Armonk, N.Y.

[21] Appl. No.: 680,216

[22] Filed: Apr. 4, 1991

[51] Int. Cl.⁵ .................................................. G03F 1/00
[52] U.S. Cl. ...................................... 250/505.1; 378/34; 378/35; 430/5
[58] Field of Search .................. 250/505.1; 378/34, 35; 430/5

[56] References Cited

U.S. PATENT DOCUMENTS

| | | | |
|---|---|---|---|
| 3,742,229 | 6/1973 | Smith et al. | 250/65 R |
| 3,873,824 | 3/1975 | Bean et al. | 250/505 |
| 4,152,601 | 5/1979 | Kadota et al. | 250/505 |
| 4,260,670 | 4/1981 | Burns | 430/5 |
| 4,454,209 | 6/1984 | Blais | 430/5 |
| 4,515,876 | 5/1985 | Yoshihara et al. | 430/5 |
| 4,522,842 | 6/1985 | Levinstein | 427/8 |
| 4,881,257 | 11/1989 | Nakagawa | 378/35 |

Primary Examiner—Jack I. Berman
Attorney, Agent, or Firm—Calfee, Halter & Griswold

[57] ABSTRACT

An X-ray mask substrate includes a silicon wafer having a square, central region etched to a thin, tensile membrane and a highly tensile film deposited on the bottom surface of the substrate to reduce substrate warpage. The square, central region of the substrate is adapted to support X-ray absorbing material during the lithography process. A layer of highly tensile film such as tungsten is deposited on the lower side of the substrate to induce a bending moment on the substrate opposite that induced during the substrate fabrication process. The thickness of the film layer is directly proportional to the amount of warpage induced in the substrate during the fabrication process. A support ring is bonded to the peripheral region of the substrate to provide integrity and support.

32 Claims, 3 Drawing Sheets

PROCESS FOR X-RAY MASK WARPAGE REDUCTION

TECHNICAL FIELD

The present invention relates to a process for reducing the warpage on an X-ray mask substrate during the fabrication process.

BACKGROUND OF THE INVENTION

Integrated Circuit (IC) technology has developed to a point where a large number of complete circuits can be manufactured on the same semiconductor wafer using planar technology. The circuits are typically incorporated onto the wafer using photolithographic techniques. Each circuit can contain a large number of components such as transistors, diodes, resistors, capacitors, etc., which are electrically interconnected in preselected arrangements. After the circuit components are formed on the wafer, the wafer is tested and diced into individual chips comprising selected arrays of circuits, which are further processed and encapsulated into common bipolar or FET ICs.

Photolithographic technology is widely used for forming the circuit patterns on the semiconductor wafers where good resolution and high yield are required. Using optical stepping techniques, the patterns initially formed on an optical mask substrate can be transferred optically onto a photoresist layer of a wafer by a step and repeat method. The step and repeat method comprises moving the mask, which contains the pattern for a portion of the wafer, to an unexposed section of the wafer and using electromagnetic radiation to image the mask pattern onto the wafer. After the pattern is imaged, the wafer is moved and the exposure is repeated. The step and repeat method for each photolithographic step continues until the entire wafer has been exposed.

The original photolithographic techniques used ultraviolet or natural light to expose the patterns on the wafer. However, ultraviolet and natural light techniques have resolution limitations. In particular, diffraction, interference, and/or light divergence is common, which causes a reduction in resolution and limits the circuit yield per wafer. In the case of very complex integrated circuits (e.g. VLSI), the size of the components forming the circuits approaches the wave lengths used to produce the masks (around 1 $\mu$m) and large geometric errors can thereby arise. The resolution ultimately obtained in the resist is thus limited by, among other factors, the wavelength of the incident light.

In part because of these disadvantages, X-ray lithography was developed to take advantage of the shorter wavelengths of the soft X-rays to expose appropriate patterns in the resists. The wavelength of the X-rays generally range from about 0.1 to 1.0 nanometers, which significantly improves the resolution and circuit yield per wafer associated with lithography.

During X-ray lithography, an X-ray source such as a synchrotron is used to direct an intense collimated beam of X-rays through an X-ray mask overlying a photoresist layer of a semiconductor wafer. The mask includes a central, X-ray transparent region with selected patterns formed of X-ray absorbing material.

The X-rays expose patterns on the underlying photoresist layer that correspond to the apertures in the mask formed by the X-ray absorbing material. However, because of the short wavelength of the X-rays, the diffraction, interference and/or divergence of the X-rays is minimized. Moreover, the back-scattering and reflection from the wafer is also reduced. Accordingly, X-ray lithography offers the advantages of improved resolution combined with a large depth of field, vertical walled patterns, and simplicity in forming the circuit patterns on the semiconductor wafers.

To form the X-ray mask substrate for use in X-ray lithography, a flat wafer formed from X-ray opaque material, e.g., silicon, has a square central region on the bottom surface of the wafer etched to a thin tensile membrane using conventional etching techniques, e.g. diffusing an appropriate dopant into the wafer as an etch-stop. The wafer is bonded to a support ring to provide support and stability for the mask. An X-ray absorbing material, e.g., gold, is then selectively deposited on the upper surface of the wafer in the central region in an appropriate circuit pattern by techniques such as electroplating. The finished mask substrate is brought proximate to a positive-acting or negative-acting resist-covered semiconductor wafer, and X-rays are applied to expose corresponding resist patterns on the underlying semiconductor wafer.

Although the X-ray mask substrate improves the resolution capabilities of X-ray lithography, the substrate fabrication process is not without drawbacks. For example, during the fabrication of the mask substrate, the substrate can experience warpage during the membrane etching process which is unacceptable for high definition imaging techniques. The mask must have an extremely flat surface for accurate reproduction of the circuit pattern. The warpage also endangers the mask at the X-ray stepper since the proximity of the mask to the semiconductor wafer is on the order of 40 $\mu$m or less.

Moreover, deformation of the X-ray absorbing material in the X and Y directions can occur during the deposition of the X-ray absorbing material on the upper surface of the substrate. One method for controlling this type of deformation is shown in Nakagawa, U.S. Pat. No. 4,881,257. In the Nakagawa patent, deformation is controlled by selectively depositing an X-ray absorbing material, e.g., tungsten or tantalum, on the upper surface of the mask substrate in both the central region and in the area surrounding the central region. The material is deposited such that an equalization of pattern densities is achieved across the substrate. The method disclosed in the Nakagawa patent is particularly suited for reducing the displacement of the X-ray absorbing material in the X and Y directions, but is not directed towards reducing the warpage of the mask substrate itself.

Moreover, it has been observed that most mask warpage is induced during the mask substrate formation steps prior to the bonding step and the deposition of the X-ray absorber material. Accordingly, it has been determined that the greatest opportunity for warpage reduction is available before this bonding step and X-ray absorber material deposition.

SUMMARY OF THE INVENTION

The present invention provides a new and useful process for reducing X-ray mask substrate warpage during the fabrication process. More particularly, the present invention provides an X-ray mask substrate wherein warpage of the substrate is reduced by selectively depositing a layer of highly tensile film on the lower surface of the mask substrate prior to any bonding step or X-ray absorbing material deposition.

The X-ray mask substrate is formed by selectively etching a square central area on the bottom surface of a silicon wafer to leave a thin tensile membrane at the top surface. Membrane formation is accomplished by initially diffusing a dopant such as boron into the wafer to form an etch-stop, and then chemically etching the wafer. Warpage of the mask substrate is likely during this process.

According to one aspect of the invention, warpage of the mask substrate can be reduced by depositing a uniform layer of tungsten film in the non-etched area of the mask substrate. In particular, the film is deposited using a DC magnetron sputter system on the lower surface of the silicon wafer in the area surrounding the membrane recess. Film thickness is controlled by time and power settings. The tensile properties of the tungsten film induce a bending moment in the substrate opposite that induced during the membrane etching process, which tends to flatten the mask substrate.

According to another aspect of the invention, asymmetrical deformations in the mask substrate can be reduced by preferentially depositing tungsten film in the more highly deformed areas. A shaping shield can be used to create a gradient of thickness across the substrate diameter. In either case, the layer of highly tensile tungsten film reduces the warpage in the mask substrate. Moreover, if the tungsten deposition initially fails to correct the warpage satisfactorily, the film can be removed and the procedure attempted again.

The thin tensile membrane of the silicon wafer is initially protected from the tungsten deposition with an adhesive polyimide patch. Similarly, the peripheral region of the substrate is also protected from the deposition with a mask. After the X-ray mask substrate is satisfactorily flattened by the deposition, the patch is removed and X-ray absorbing material is selectively deposited on the upper surface of the mask substrate in the membrane area to create the mask pattern. Further, the mask is removed and the peripheral region of the substrate is bonded to a PYREX glass support ring to provide support and stability.

One useful feature of the invention is that the application of a thin, highly tensile film such as tungsten effectively reduces mask substrate warpage before the mask substrate is bonded to the mask support ring.

Another useful feature of the invention is that greater resolution is provided in the lithography process because the distance between the mask and the resist-covered semiconductor wafer can be minimized.

Another useful feature of the invention is that asymmetrical deformations of the mask substrate can be reduced using a shaping shield to selectively deposit the tungsten film.

Yet another useful feature of the invention is that the deposition of the tensile film does not reduce the bond quality with the mask substrate support ring.

A further feature of the invention is that the yield of raw X-ray mask substrates having acceptable warpage tolerances is increased, and therefore more consistent production of mask substrates is achieved.

Further features and advantages of the invention will become apparent from the following description and the accompanying drawings.

DETAILED DESCRIPTION OF THE PREFERRED EMBODIMENT

Figure 1:
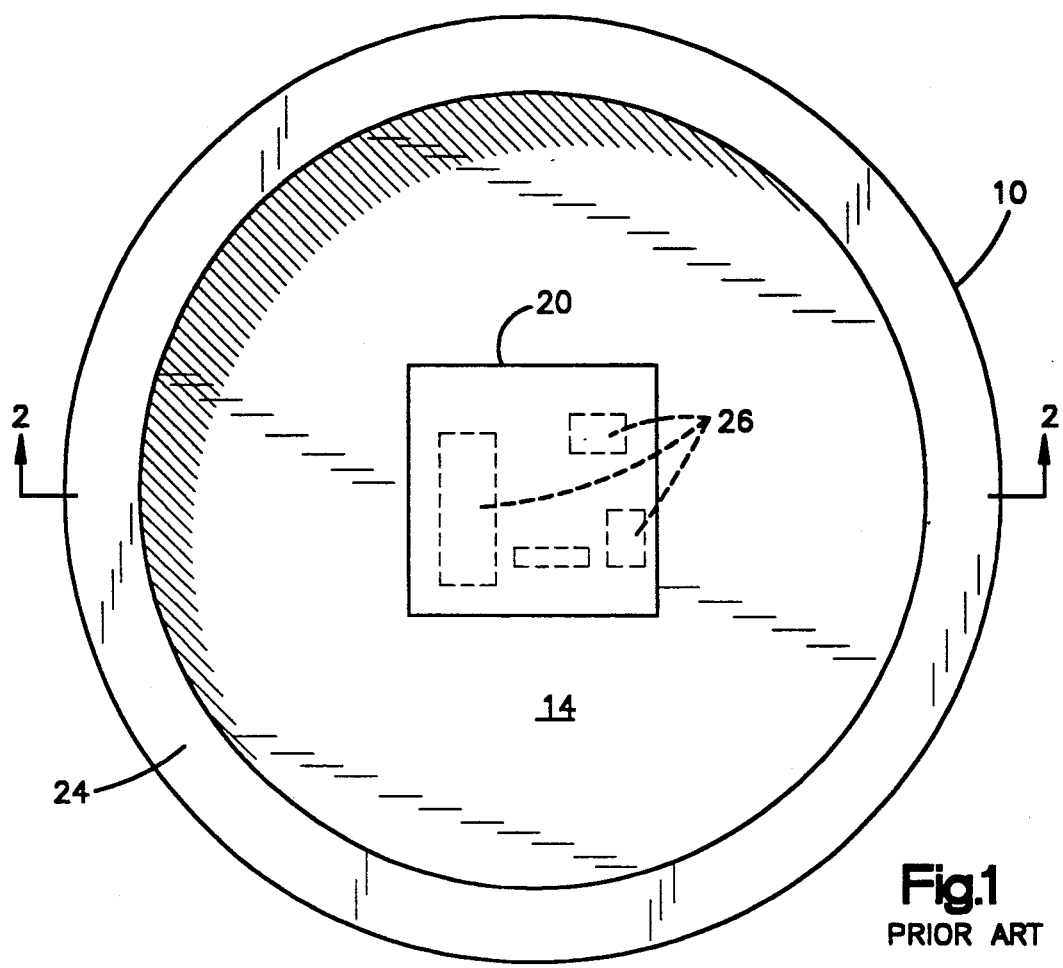
FIG. 1 shows a bottom plan view of an X-ray mask of the prior art illustrating the initial fabrication steps.
Figure 2:
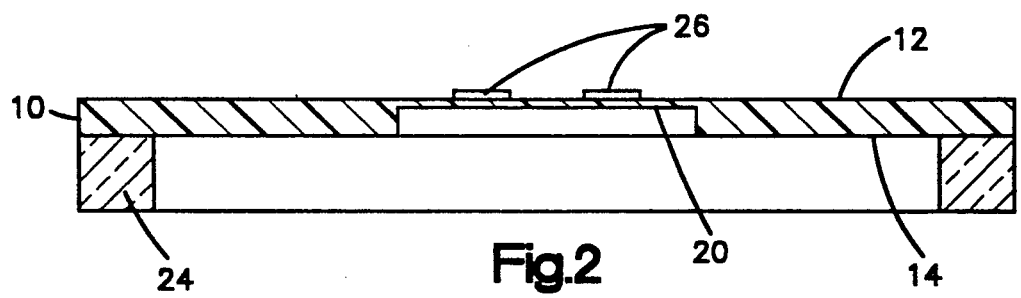
FIG. 2 is a cross-sectional view of the X-ray mask taken substantially along the plane designated by the lines 2—2 in FIG. 1, illustrating a desired mask substrate.

As described above, the present invention relates to a process for reducing X-ray mask substrate warpage during the substrate fabrication process by selectively depositing a thin, highly tensile film on the lower surface of the mask substrate. As shown in FIGS. 1 and 2, an X-ray mask substrate constructed according to conventional techniques comprises an X-ray opaque wafer 10, typically formed from monocrystalline silicon or other appropriate material, and having a substantially circular top plan view. The wafer 10 includes substantially parallel top and bottom surfaces 12 and 14, respectively. The wafer 10 is about 100 mm in diameter and about 0.625 mm in thickness; however, other sizes, particularly other diameter wafers, may also be used.

Initially in the mask substrate fabrication process, an appropriate dopant, such as boron, is diffused into the top surface 12 and the bottom surface 14 of the wafer. The boron is caused to diffuse to a selected depth in the wafer and acts as an etch-stop during a subsequent etching step. A square central region 20 on the bottom surface 14 of the wafer is reactive ion etched through the boron doped depth to expose undoped silicon. The wafer is then chemically etched with an aqueous mixture of ethanolamine and gallic acid in the non-doped area to leave a thin tensile membrane in the central region. The thin membrane forms an X-ray translucent window about 2.5 μm thick which provides for increased X-ray transmission through the substrate material at the window region. The etching and doping techniques described above are well known techniques to those of ordinary skill in the silicon wafer fabrication art. Hence, no further discussion of these techniques is deemed necessary. Moreover, other etching techniques well known to those in the art are also within the scope of this invention. Additionally, other membrane materials suitable for X-ray mask application, e.g., silicon carbide, silicon nitride, diamond, etc. can also be used with the present invention.

During the subsequent X-ray mask substrate fabrication steps, which are also well known to those of ordinary skill in the art, the peripheral region of the silicon wafer 10 is bonded to an annular support ring 24, as illustrated in FIG. 2, formed from glass or other appropriate material. A preferred support ring is manufactured by Corning Glass Works under the trademark PYREX, glass code No. 7740. The support ring 24 is about 10 mm wide and 10 mm thick, and imparts strength, integrity and a stable tension to the membrane region 20 of the wafer.

A layer 26 of X-ray absorbing material, e.g., gold, tungsten, tantalum, or other appropriate X-ray absorber, is then selectively deposited on the top surface 12 of the substrate. This deposition is performed by conventional electroplating techniques, which are also well known to those in the art. For example, the X-ray absorbing material can be selectively deposited using the techniques described in Nakagawa, U.S. Pat. No. 4,881,257, which reduces deformations of the X-ray absorbing material in the X and Y directions. In any case, the X-ray absorbing material is deposited to form a circuit pattern on the mask membrane to be used in the lithography process. Additional conventional fabricating techniques are then provided to complete and protect the patterns on the X-ray mask substrate.

The finished X-ray mask substrate 10 is installed in a X-ray lithographic stepper assembly to expose a portion of a resist-covered semiconductor wafer, for example as shown in Nakagawa, U.S. Pat. No. 4,881,257. In particular, an X-ray source such as a synchrotron (not shown) generates an intense collimated beam of X-rays which passes through apertures in the mask formed by the X-ray absorbing material. The X-ray beam exposes selective portions of the resist-covered semiconductor wafer to form a circuit pattern. The stage in which the semiconductor wafer is mounted is then moved, and the exposure step is repeated for another portion of the wafer. This process is repeated a selected number of times to expose the desired portion of the semiconductor wafer. Additional masks and processing steps, which are also well known to those of ordinary skill in the art, provide a final circuit design for the semiconductor wafer.

Figure 3:
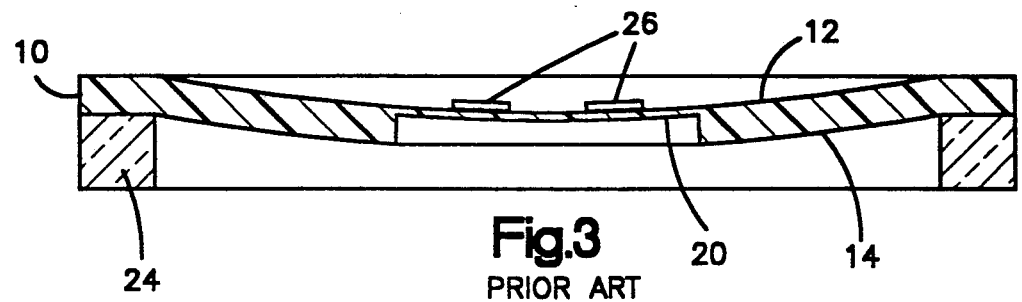
FIG. 3 is a cross-sectional side view of the X-ray mask of FIG. 2, illustrating typical warpage of the mask substrate.
Figure 4:
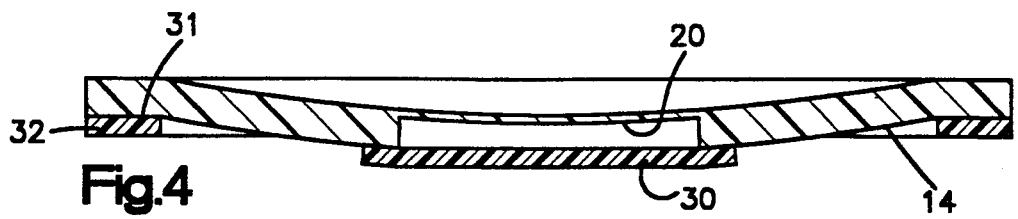
FIGS. 4-7B are cross sectional views of an X-ray mask substrate constructed according to the present invention, diagrammatically illustrating the fabrication steps.

FIGS. 1 and 2 illustrate the desired shape of the mask substrate, wherein the substrate is substantially flat across its diameter. Such a mask substrate has the necessary flatness for X-ray lithography techniques. However, due to the nature of the fabrication process, e.g., doping and etching the substrate, the substrate has a tendency to deform from a substantially planar condition to a concave condition relative to the top of the substrate, for example as illustrated in FIGS. 3 and 4. The concavity typically has a good radial symmetry across the substrate, and tends to flatten out in the peripheral regions of the substrate when bonded to the relatively more rigid support ring 24.

Figure 5:
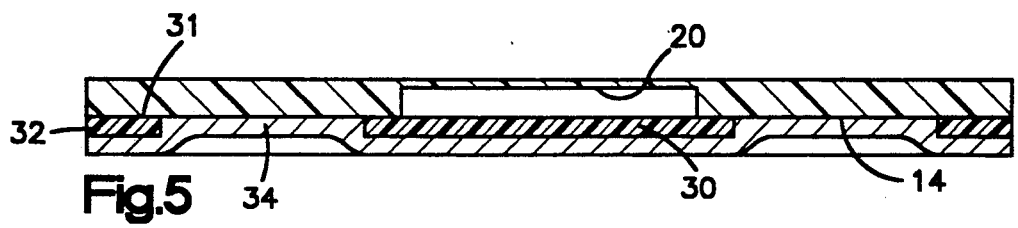
Figure 6:
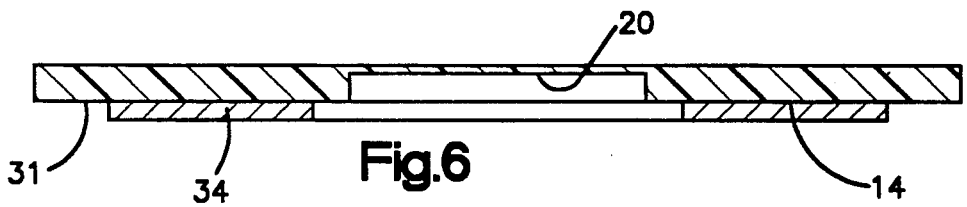

According to the present invention, the concavity is effectively reduced by depositing a thin layer of highly tensile film across the lower surface of the silicon wafer prior to the bonding of the support ring and prior to the deposition of the X-ray absorbing material, as illustrated in FIGS. 5-6. The present invention preferably uses tungsten as the highly tensile film; however, any material which generates a proper tensile stress at room temperature when deposited on a silicon wafer and which will bond to the wafer can be used as a substitute for tungsten. In any case, the corrective film is deposited with a DC magnetron sputter system or other conventional deposition system capable of depositing tungsten (or substitute materials) in a tensile state on the silicon mask as is known to those skilled in the art.

The film is applied in a uniform layer to the lower surface 14 of the mask substrate in proportion to the amount of warpage induced according to the equation:

$$W = \frac{3}{4} \frac{1 - \nu_s}{E_s} \frac{t_f}{t_s^2} d^2 \sigma$$

where:
 W = desired warpage correction (measured as the absolute value of the maximum difference in heights of the measured surface);
 $\nu_s$ = substrate material Poisson's ratio;
 $E_s$ = substrate material modulus of elasticity;
 $t_f$ = corrective backside film thickness;
 $t_s$ = substrate thickness;
 d = substrate diameter;
 $\sigma$ = film stress as measured with respect to particular deposition parameters.

The equation is good to a first approximation, and empirical corrections can be made to the equation based on routine experimental observations, as discussed herein in more detail. Various warpage requirements are thereby accommodated by selecting an appropriate corrective film thickness. It has been determined that the film thickness can range from 100 Å to 10,000 Å, depending on the nature of the film and substrate material, the thickness of the substrate, the substrate diameter and the warpage correction. The film thickness during the deposition is controlled by time and power settings on the sputter system.

Due to the nature of the tungsten deposition process, the central region 20 of the mask substrate must be protected from the film deposition since the metal film will decrease X-ray transmission. Accordingly, as shown in FIG. 4, a circular patch 30 is initially applied to the lower surface 14 to cover the central region 20. The patch 30 functions as a mask and is peeled off during subsequent fabrication steps (e.g., FIG. 6). The patch 30 is preferably formed from appropriate adhesive polyimide material or metal and can be vented (not shown) to prevent a differential pressure from forming between the volume enclosed by the polyimide patch and the deposition system vacuum chamber.

Similarly, the peripheral region 31 of the silicon wafer must also be masked to provide for proper bonding to the support ring. To this end, a 10 mm wide circumferential bonding area is masked on the silicon wafer as shown in FIG. 4. The masking is accomplished with a 80 mm inner diameter substrate holder 32 which excludes the 10 mm wide peripheral bonding area on the wafer from deposition. It has been determined that the tungsten film adjacent the bond area has no effect on bond quality. Accordingly, after the tungsten deposition has occurred (e.g., FIG. 5), the substrate holder 32 is removed (e.g., FIG. 6) and the wafer can be bonded to the support ring 24 (e.g., FIG. 7).

Accordingly, after the patch 30 and substrate holder 32 have been removed, the tungsten film remains on the lower surface 14 of the mask substrate in the region between the patch 30 on the central region 20, and the peripheral region 31, as shown in FIGS. 6 and 7. It has been determined that the thermal and intrinsic tensile stress of the tungsten induces a bending moment on the lower surface 14 of the substrate that tends to counteract the stresses created during the substrate fabrication process. The induced bonding moment tends to flatten the mask substrate. Accordingly, the present invention provides an X-ray mask substrate having a thin, highly tensile film selectively deposited on the lower side of the substrate that effectively reduces the mask warpage created during the mask substrate formation steps.

Figure 7A:
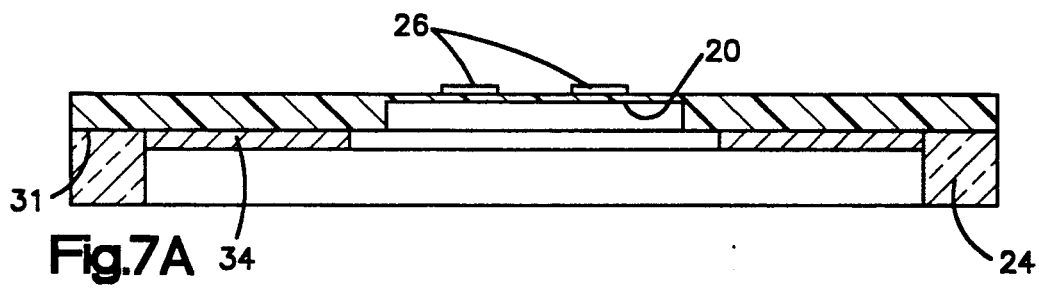
Figure 7B:
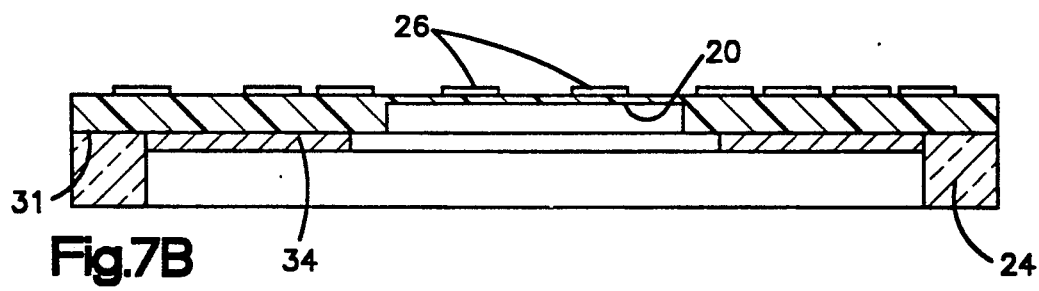

After the tungsten deposition is complete and an appropriate reduction in warpage has been realized, the support ring 24 is bonded to the mask substrate and the X-ray absorbing material 26 is selectively applied to the upper surface 12 of the X-ray mask substrate 10, preferably in the central region as illustrated in FIG. 7A. Alternatively, the X-ray absorbing material 26 can be selectively applied in both the central region and in the area surrounding the central region, as illustrated in FIG. 7B. In this case, the material is selectively applied to provide for an equalization of pattern densities across the mask substrate and reduce the deformation of the X-ray absorber material in the X and Y directions. Additional fabrication techniques known to those skilled in the art are then performed to complete and protect the absorbing material patterns on the X-ray mask substrate.

According to an additional aspect of the invention, asymmetrical deformations of the mask substrate can be reduced by preferentially depositing thicker film in the more highly deformed areas. This is accomplished by using a shaping shield over the X-ray mask substrate to expose certain areas of the substrate to the deposition process for longer periods of time. The shield can be thin gauge stainless steel, and can be dimensioned to accommodate different asymmetrical warpage correction requirements. The shield acts as a mask and can be shaped to create a grading of thickness across the diameter of the X-ray mask substrate. Such a shaping shield can apply the film to wafers having conventional square, centrally etched regions, or can apply the film to wafers having, e.g. rectangular or off-center etched regions.

In any case, if the deposition of the tungsten on the wafer fails to satisfactorily correct the warpage, the film can be stripped and the procedure attempted again. Such stripping can be done for example, using an FSI Saturn spray processor in a Huang A and Huang B process, which are conventional techniques known to those skilled in the mask substrate fabrication process. After the stripping process, the substrate can be reintroduced in the sputter system for another deposition. Applicant has determined that this rework step does not appreciably damage the mask substrate.

Tests of warpage reduction versus deposition of tungsten have been performed. An analysis of the results has determined that such deposition effectively reduces the warpage in the mask substrate during the mask fabrication process. For example, using the above equation and a silicon mask substrate requiring a warpage correction of approximately 3.1 $\mu$m, it was determined that a corrective backside tungsten film thickness ($t_f$) of approximately 700 Å was necessary to correct the warpage. The calculation was based upon a warpage (w) of 3.1 $\mu$m, a single crystal silicon Poisson ratio ($\nu_s$) of 0.28, a modulus of elasticity ($E_s$) of $1.3 \times 10^{12}$ Dynes/cm$^2$, a substrate thickness ($t_s$) of 0.625 mm, a substrate diameter (d) of 100 mm, and a film stress ($\sigma$) of $5 \times 10^9$ Dynes/cm$^2$.

Figure 8:
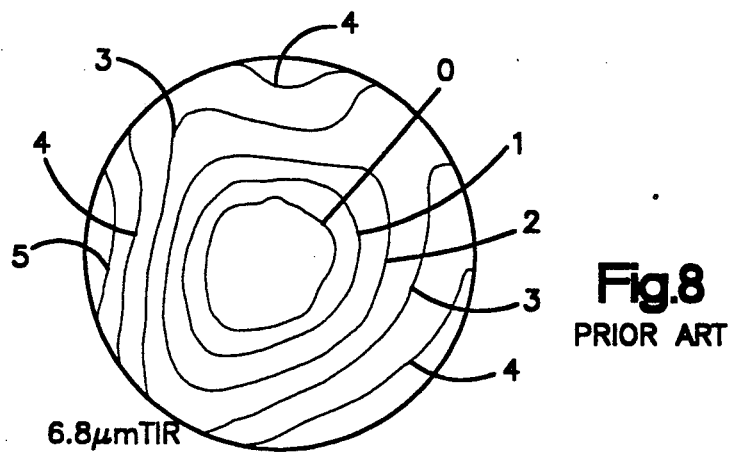
FIG. 8 is a top plan view of an unbonded X-ray mask substrate showing topographic contour lines illustrating symmetrical warpage of the mask substrate.

FIGS. 8 and 9A-9F graphically illustrate the results of tests where thin layers (200 Angstrom thick) of tungsten are consecutively applied to a warped silicon wafer. FIG. 8 illustrates the warped mask substrate after etching and doping the substrate, but prior to depositing tungsten on the lower surface of the substrate. The contour lines and the actual amount of warpage (in $\mu$m), defined as the total indicated reading (TIR) as determined by a phase measuring grazing incidence laser interferometer, indicate an initial warpage of 6.8 $\mu$m in FIG. 8. FIGS. 9A-9F illustrate the mask substrate after the deposition of consecutive layers of tungsten (approximately 200 Å per layer) on the lower surface. The contour lines and the TIR indicate a gradual reduction in warpage across the diameter of the substrate as the layers of tungsten are applied up to point, after which there is actually an increase in the TIR values.

Figure 9A:
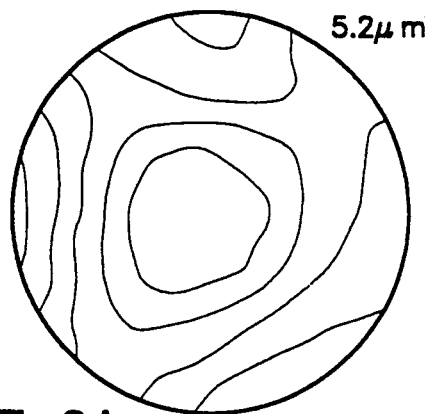
FIGS. 9A-9F are top plan views of an unbonded X-ray mask substrate showing topographic contour lines illustrating the change in warpage as consecutive layers of tungsten film are applied to the mask substrate.
Figure 9B:
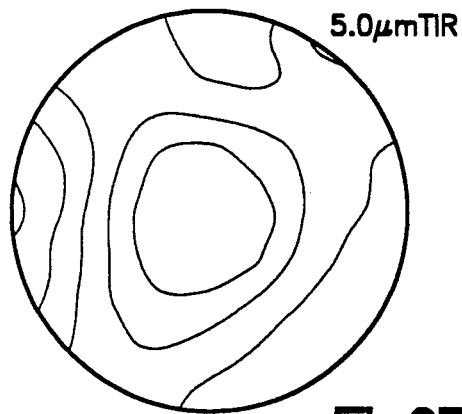
Figure 9C:
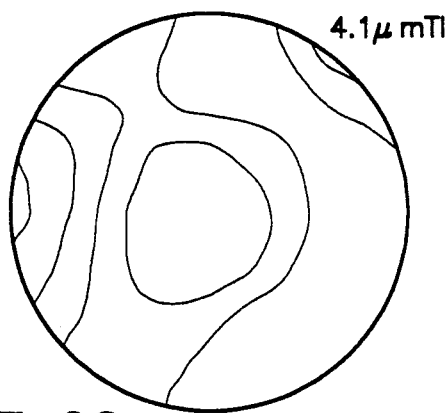
Figure 9D:
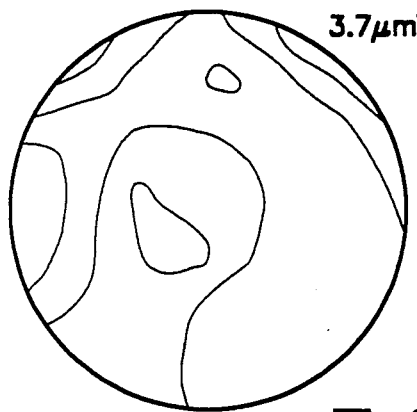
Figure 9E:
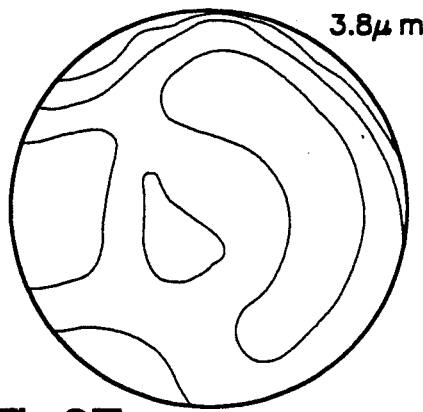
Figure 9F:
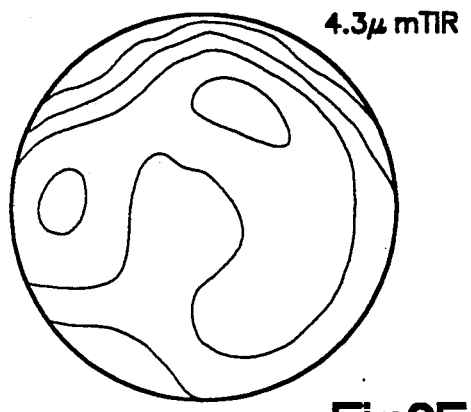

In particular, after 200 Å of tungsten have been applied (e.g., FIG. 9A), the contour lines and TIR illustrate a slight improvement in flatness across the substrate. Further, FIGS. 9B-9D sequentially illustrate consecutive layers of tungsten providing a decrease in warpage across the substrate with a continuous drop in TIR to 3.7 $\mu$m in FIG. 9D, after which 800 Å of tungsten has been applied. However, in FIG. 9E, after approximately 1000 Å of tungsten have been applied, there is no further reduction in warpage, as can be seen by comparing the contour lines in FIGS. 9D and 9E, and indeed the TIR value has increased slightly from 3.7 $\mu$m to 3.8 $\mu$m (although this is within the realm of measuring error). Moreover, when an additional 200 Å layer of tungsten is applied to the substrate, there flatness, as shown in FIG. 9F, wherein the TIR value has climbed to 4.3 $\mu$m. Thus, the addition of the tungsten reduces warpage and improves flatness up to a point (e.g., FIGS. 9A-9D), but after that point there is first a leveling off of such improvement and then a reversal in such improvement and actually a degradation of the flatness (e.g., FIGS. 9E-9F).

Although the invention has been shown and described with respect to certain preferred embodiments, it is obvious that equivalent alterations and modifications will occur to others skilled in the art upon their reading and understanding of the specification. Accordingly, the foregoing detailed specification should be exemplary in nature and not as limiting to the scope and spirit of the invention set forth in the appended claims.

What is claimed is:

1. An exposure mask for use in a lithography process, comprising:

a substantially X-ray opaque body having a central area and substantially parallel top and bottom surfaces, said central area on said bottom surface having an X-ray translucent mask region substantially parallel with said top and bottom surfaces, said body being normally warped with respect to the top surface by internal forces present during formation of the X-ray translucent mask region, a layer of film deposited on said bottom surface in the area surrounding said central area, said film selected to apply compensating tensile forces when deposited on said body which reduce the warpage caused by the internal forces present during formation of the mask region.

2. An exposure mask as in claim 1, wherein said X-ray opaque body comprises a monocrystalline silicon wafer.

3. An exposure mask as in claim 1, wherein said X-ray translucent mask region in said central area on said bottom surface includes a recess.

4. An exposure mask as in claim 3, wherein said recess forms a thin tensile membrane adapted to provide increased X-ray transmission.

5. An exposure mask as in claim 4, wherein said body in the central area is about 0.0025 mm thick, and said body surrounding the central area is about 0.625 mm thick.

6. An exposure mask as in claim 1, wherein said body is normally warped concave with respect to the top surface by internal forces present during formation of the X-ray translucent mask region.

7. An exposure mask as in claim 6, wherein said film induces a bending moment opposite that induced during the formation of said X-ray translucent mask region.

8. An exposure mask as in claim 7, wherein the film is a highly tensile tungsten film.

9. An exposure mask as in claim 8, wherein the thickness of said film is between about 100 Å and about 10,000 Å.

10. An exposure mask as in claim 9, wherein the film is deposited in a uniform layer across the bottom surface.

11. An exposure mask as in claim 9, wherein the film is deposited in a gradient across said bottom surface.

12. An exposure mask as in claim 1, wherein said bottom surface of said body has a portion which is bonded to a support ring.

13. An exposure mask as in claim 12, wherein said support ring is bonded directly to the bottom surface of said body.

14. An exposure mask as in claim further comprising a layer of X-ray absorbing material selectively deposited in a predetermined pattern on said top surface of said body.

15. An exposure mask as in claim 14, wherein said X-ray absorber material is selectively deposited to provide equalization of the pattern densities across the body.

16. An exposure mask as in claim 15, wherein said X-ray absorbing material is gold, tungsten or tantalum.

17. A method for fabricating an X-ray mask substrate, comprising:
   forming an X-ray translucent mask region in a central area of a substantially planar substrate having a top and bottom surface, the formation of said X-ray translucent mask region inducing a bending moment which causes a warped configuration of said substrate with respect to the top surface,
   selectively applying a layer of highly tensile film to the bottom surface of the substrate in the area surrounding the central region,
   selecting the thickness of the film layer to induce a bending moment in the substrate opposite that induced during the formation of the X-ray translucent mask region to provide a more planar and less-warped substrate having an X-ray translucent mask region.

18. A method as in claim 17 wherein the substrate is monocrystalline silicon.

19. A method as in claim 17, wherein a recess is formed by etching the central region of the substrate from the bottom surface, said recess forming a thin tensile membrane adapted to provide increased X-ray transmission.

20. A method as in claim 19, wherein a dopant is selectively diffused into at least one surface of the substrate, said dopant providing an etch-stop during the etching process.

21. A method as in claim 20, wherein the dopant is boron.

22. A method as in claim 17, wherein the layer of film is tungsten.

23. A method as in claim 22, wherein the tungsten film is applied in a uniform layer.

24. A method as in claim 22, wherein the tungsten film is selectively applied in a gradient across the bottom surface of the substrate in the area surrounding the central region.

25. A method as in claim 17 wherein the layer is applied in multiple steps, and wherein the amount of warpage is measured after at least one step.

26. A method as in claim 25, wherein the thickness of the film initially applied in the first step to the bottom surface of the substrate is determined by the equation:

$$W = \frac{3}{4} \frac{1 - v_s}{E_s} \frac{t_f}{t_s^2} d^2 \sigma$$

where:
   W = desired warpage correction (measured as the absolute value of the maximum difference in heights of the measured surface);
   $v_s$ = substrate material Poisson's ratio;
   $E_s$ = substrate material modulus of elasticity;
   $t_f$ = film thickness;
   $t_s$ = substrate thickness;
   d = substrate diameter;
   $\sigma$ = film stress as measured with respect to particular deposition parameters.

27. A method as in claim 17, wherein the formation of said X-ray translucent mask region induces a bending moment which causes a warped configuration of said substrate concave with respect to the top surface.

28. A method as in claim 17, wherein a support ring is bonded directly to the peripheral region of the substrate, and X-ray absorbing material is applied to the top surface of the substrate in the central region after the film is applied.

29. A method as in claim 28, wherein said X-ray absorbing material is selectively deposited in a predetermined pattern on the top surface of said substrate.

30. A method as in claim 29, wherein said X-ray absorbing material is selectively deposited on the top surface of said substrate to provide an equalization of the pattern densities across the substrate.

31. A method for exposing selected patterns on a photoresist-covered semiconductor wafer with X-rays during a lithographic process, comprising the steps of:
   forming an X-ray translucent window in a substantially X-ray opaque substrate having a top and bottom surface, the formation of said X-ray translucent window inducing a bending moment which causes a warped configuration of said substrate with respect to the top surface,
   selectively applying a layer of highly tensile film to the bottom surface of the substrate in the area surrounding the central region,
   selecting the thickness of the layer to induce a bending moment in the substrate opposite that induced during the formation of the X-ray translucent window to provide a more planar and less-warped substrate having an X-ray window,
   bonding a support ring to the periphery of the bottom surface of the substrate,
   selectively depositing an X-ray absorbing material in the central region on the top surface of the substrate,
   locating the substrate proximate the photoresist-covered semiconductor wafer, directing the X-rays through apertures formed by the X-ray absorbing material on the substrate to expose selected patterns on the photoresist-covered semiconductor wafer.

32. In an exposure mask for use in a lithography process having a substantially X-ray opaque body with a central area and substantially parallel top and bottom surfaces, a recess formed in the central area on the bottom surface forming a thin X-ray transparent mask region and normally warping the body concave with respect to the top surface by internal forces present during formation of the recess, the improvement comprising a layer of film deposited on the bottom surface of the body in the area surrounding the central area, said film selected to apply compensating tensile forces when deposited on the body which reduce the warpage caused by the internal forces present during formation of the recess.

* * * * *